(12) United States Patent
Bjormander et al.

(10) Patent No.: US 10,570,509 B2
(45) Date of Patent: Feb. 25, 2020

(54) CVD COATED CUTTING TOOL

(71) Applicant: SANDVIK INTELLECTUAL PROPERTY AB, Sandviken (SE)

(72) Inventors: Carl Bjormander, Stockholm (SE); Erik Lindahl, Uppsala (SE); Jan Engqvist, Uppsala (SE)

(73) Assignee: SANDVIK INTELLECTUAL PROPERTY AB, Sandviken (SE)

( * ) Notice: Subject to any disclaimer, the term of this patent is extended or adjusted under 35 U.S.C. 154(b) by 222 days.

(21) Appl. No.: 15/537,312

(22) PCT Filed: Dec. 17, 2015

(86) PCT No.: PCT/EP2015/080242
§ 371 (c)(1),
(2) Date: Jun. 16, 2017

(87) PCT Pub. No.: WO2016/097157
PCT Pub. Date: Jun. 23, 2016

(65) Prior Publication Data
US 2017/0342554 A1   Nov. 30, 2017

(30) Foreign Application Priority Data

Dec. 19, 2014   (EP) .................................. 14199221

(51) Int. Cl.
*B23B 27/14*   (2006.01)
*C23C 16/40*   (2006.01)
(Continued)

(52) U.S. Cl.
CPC .......... *C23C 16/403* (2013.01); *B23B 27/148* (2013.01); *C23C 16/32* (2013.01);
(Continued)

(58) Field of Classification Search
USPC ........... 51/307, 309; 428/336, 698, 701, 702
See application file for complete search history.

(56) References Cited

U.S. PATENT DOCUMENTS 5,487,625 A *   1/1996  Ljungberg ............ C23C 16/403
                                                51/307
7,163,735 B2 *  1/2007  Ruppi .................. C23C 16/0272
                                                428/701

(Continued)

FOREIGN PATENT DOCUMENTS

CN        1456703 A    11/2003
CN        1836811 A     9/2006
(Continued)

OTHER PUBLICATIONS

Ruppi "Enhanced performance of alpha-Al2O3 coatings by control of crystal orientation" Surface & Coatings Technology 202 (2008) p. 4527-4269. (Year: 2008).*

(Continued)

*Primary Examiner* — Archene A Turner
(74) *Attorney, Agent, or Firm* — Corinne R. Gorski

(57) ABSTRACT

A coated cutting tool for chip forming machining of metals includes a substrate having a surface coated with a chemical vapour deposition (CVD) coating. The coated cutting tool has a substrate coated with a coating including a layer of α-Al2O3, wherein the α-Al2O3 layer exhibits a dielectric loss of 10−6≤tan δ≤0.0025, as measured with AC at 10 kHz, 100 mV at room temperature of 20° C.

13 Claims, 1 Drawing Sheet

(51) Int. Cl.
    *C23C 28/04*    (2006.01)
    *C23C 16/56*    (2006.01)
    *C23C 16/32*    (2006.01)
    *C23C 16/34*    (2006.01)
    *C23C 16/36*    (2006.01)

(52) U.S. Cl.
    CPC .............. *C23C 16/34* (2013.01); *C23C 16/36* (2013.01); *C23C 16/56* (2013.01); *C23C 28/042* (2013.01); *C23C 28/044* (2013.01); *C23C 28/048* (2013.01); *B23B 2222/84* (2013.01); *B23B 2224/04* (2013.01); *B23B 2224/32* (2013.01); *B23B 2224/36* (2013.01); *B23B 2228/04* (2013.01); *B23B 2228/24* (2013.01); *B23B 2228/36* (2013.01)

(56) References Cited

U.S. PATENT DOCUMENTS

| | | | |
|---|---|---|---|
| 2002/0122701 A1* | 9/2002 | Ljungberg | C23C 16/403 407/119 |
| 2014/0173996 A1* | 6/2014 | Stiens | C23C 16/403 51/309 |
| 2014/0193624 A1* | 7/2014 | Stiens | C23C 30/005 428/216 |
| 2016/0175940 A1* | 6/2016 | Lindahl | B23B 27/148 428/141 |

FOREIGN PATENT DOCUMENTS

| | | | |
|---|---|---|---|
| CN | 101898890 A | | 12/2010 |
| CN | 102061454 | * | 5/2011 |
| CN | 102858483 A | | 1/2013 |
| CN | 104053815 A | | 9/2014 |
| EP | 1947213 | * | 7/2008 |
| EP | 2570510 A1 | | 3/2013 |
| GB | 2212747 A | | 8/1989 |
| JP | 2003-025114 | * | 1/2003 |
| JP | 2009-202264 | * | 9/2009 |
| WO | 2013037997 A1 | | 3/2013 |
| WO | 2013037998 A2 | | 3/2013 |
| WO | 2014198881 A1 | | 12/2014 |

OTHER PUBLICATIONS

Osada et al "Wear mechanism of thermally transformed CVD Al2O3 layer" International Journal of Refractory Metals & Hard Materials 24 (2006) p. 387-391. (Year: 2006).*

Alford et al Sintered alumina with low dielectric loss J. Appl. Phys. 80 (10) (1996) p. 5895-5898. (Year: 1996).*

Woode et al "Measurement of dielectric loss tangent of alumina at microwave frequencies and room temperature". Electronic Letters vol. 30 No. 25 p. 21202122. (Year: 1994).*

* cited by examiner

CVD COATED CUTTING TOOL

RELATED APPLICATION DATA

This application is a § 371 National Stage Application of PCT International Application No. PCT/EP2015/080242 filed Dec. 17, 2015 claiming priority of EP Application No. 14199221.4, filed Dec. 19, 2014.

TECHNICAL FIELD

The present invention relates to a coated cutting tool for chip forming machining of metals comprising a substrate having a surface coated with a chemical vapour deposition (CVD) coating. The coated cutting tool in accordance with the present invention is particularly useful in applications with high demands of abrasive wear resistance in for example turning, milling or drilling of a metallic material such as alloyed steel, carbon steel or tough hardened steel.

BACKGROUND

Chemical Vapour Deposition (CVD) of wear resistant coatings on cemented carbide cutting tools has been in industrial practice for many years. Coatings such as TiCN and $Al_2O_3$ have shown to improve the wear resistance on cutting inserts in cutting of many different materials. A combination on an inner layer of TiCN and an outer layer of $\alpha$-$Al_2O_3$ can be found on many commercial cutting inserts aimed for turning of for example steel.

It is an object of the invention to provide an alumina coated cutting tool insert with improved performance in cutting operations. It is a further object of the invention to provide a coated cutting tool with improved wear resistance, for example a higher resistance to crater wear and an enhanced resistance to flank wear of the cutting edge. Another object of the invention is to provide a cutting tool with high performance in turning of steel, such as alloyed steels, carbon steels and tough hardened steels.

SUMMARY

The cutting tool in accordance with the present invention comprises a substrate coated with a coating comprising a layer of $\alpha$-$Al_2O_3$, wherein said $\alpha$-$Al_2O_3$ layer exhibits a dielectric loss of $10^{-6} \leq \tan \delta \leq 25 \times 10^{-4}$, as measured with AC at 10 kHz, 100 mV at room temperature of 20° C. This $\alpha$-$Al_2O_3$ layer has shown to be advantageous as a layer on cutting tools due to its unexpectedly high crater and flank wear resistance.

Dielectric loss quantifies a dielectric material's inherent dissipation of electromagnetic energy into, e.g., heat. The dielectric loss can be parameterized in terms of the loss tangent, $\tan \delta$, where $\delta$ is the loss angle. An oscillating electric field applied over a dielectric material drives the charge in the dielectric material back and forth between two alternative configurations. This charge-motion corresponds to an electric current that, if there were no losses, would be 90 degrees out of phase with the voltage. The loss angle $\delta$ corresponds to a phase shift from this theoretical 90 degree value, caused by dielectric losses. Hence, the loss tangent is a measure characterizing the dielectric loss for a material. The loss tangent can also be denoted $\tan \delta$ or dissipation factor (D).

The dielectric loss of a coating of a dielectric material such as $\alpha$-$Al_2O_3$ is related to presence of defects within a coating such as impurities, porosity and surface states, such that a dense (absence of pores), pure (absence of impurities) and high grain boundary cohesion results in a lower value of $\tan \delta$. Both the presence of impurities and pores in an $\alpha$-$Al_2O_3$ layer on a cutting tool decrease the wear resistance of the coating during cutting operations. The lower the value of $\tan \delta$ of an $\alpha$-$Al_2O_3$ layer indicate that the properties of the layer is closer to sapphire properties. A theoretical value of a single crystalline sapphire ($\alpha$-$Al_2O_3$) of $8 \times 10^{-8}$ has been presented in literature.

The dielectric loss of an $\alpha$-$Al_2O_3$ layer on a cutting tool may also relate to other properties of the coating such as residual stresses in the coating. The residual stress as originating from the shrinkage of the coating after deposition at increased temperature is at a level of typically about 100-500 MPa (tensile) as measured with for example XRD and the $\sin^2 \psi$ method.

The dielectric loss of an $\alpha$-$Al_2O_3$ layer on a cutting tool may also relate to the grain size and type of grain boundaries in the coating. Any impurities are most probably located in the grain boundaries. The average grain size of the $\alpha$-$Al_2O_3$ layer of the present invention may typically be about 0.2-2 µm in width as measured in a polished cross section of the coating in a direction perpendicular to the growth direction of the coating in for example a scanning electron microscope.

The $\alpha$-$Al_2O_3$ layer is preferably deposited with thermal CVD. Alternatively other CVD deposition processes can be used. This is also the case for any further layers of the coating as disclosed below.

The $\alpha$-$Al_2O_3$ layer covers at least the area of the cutting tool that is engaged in cutting in a cutting operation, covering at least the areas exposed for crater wear and/or flank wear. Alternatively the whole cutting tool can be coated with the $\alpha$-$Al_2O_3$ layer and/or with any further layers of the coating.

In one embodiment of the present invention the thickness of the $\alpha$-$Al_2O_3$ layer is 2-20 µm, preferably 2-10 µm, most preferably 3-7 µm.

In one embodiment of the present invention the dielectric loss ($\tan \delta$) of the $\alpha$-$Al_2O_3$ layer is higher than or equal to $10^{-5}$, preferably higher than or equal to $10^{-4}$, most preferably higher than or equal to $5 \times 10^{-4}$. If the dielectric loss is too low the coating might appear brittle in cutting operations.

In one embodiment of the present invention the dielectric loss ($\tan \delta$) of the $\alpha$-$Al_2O_3$ layer is lower than or equal to $20 \times 10^{-4}$, preferably lower than or equal to $15 \times 10^{-4}$, more preferably lower than or equal to $10 \times 10^{-4}$, most preferably lower than or equal to $7 \times 10^{-4}$. These lower values indicated that the $\alpha$-$Al_2O_3$ layer is very pure and dense and therefore performs outstanding in crater and flank wear demanding cutting operations.

The dielectric loss ($\tan \delta$) of the $\alpha$-$Al_2O_3$ layer is measured as an average value of 14 separate measurements. The measurement of the dielectric loss ($\tan \delta$) of the $\alpha$-$Al_2O_3$ layer is preferably measured on a flank face of the cutting tool. The dielectric loss measurement is preferably performed on a surface of a cutting tool that is not post-treated by for example blasting or brushing.

In one embodiment of the present invention the $\alpha$-$Al_2O_3$ layer exhibits a texture coefficient TC(hkl), as measured by X-ray diffraction using CuK$\alpha$ radiation and $\theta$-$2\theta$ scan, defined according to Harris formula $$TC(hkl) = \frac{I(hkl)}{I_0(hkl)} \left[ \frac{1}{n} \sum_{n=1}^{n} \frac{I(hkl)}{I_0(hkl)} \right]^{-1} \quad (1)$$

where I(hkl) is the measured intensity (integrated area) of the (hkl) reflection, $I_0$(hkl) is the standard intensity according to ICDD's PDF-card No. 00-010-0173, n is the number of reflections used in the calculation, and where the (hkl) reflections used are (1 0 4), (1 1 0), (1 1 3), (0 2 4), (1 1 6), (2 1 4), (3 0 0) and (0 0 12), wherein a TC(hkl) is higher than 6, preferably higher than 7. In one embodiment the TC(0 0 12) of the $\alpha$-$Al_2O_3$ layer is higher than 6, preferably higher than 7.

In one embodiment of the present invention the coating further comprises a refractory layer comprising a material selected from the group TiCN, TiN, TiC, ZrN, ZrCN, ZrC, HfN, HfC, HfCN or combinations thereof, preferably TiCN, located between the substrate and the $\alpha$-$Al_2O_3$ layer. In one embodiment of the present invention the refractory layer consists of a TiCN layer. The grains of the TiCN layer are preferably columnar. In one embodiment of the present invention the thickness of said refractory layer is 4-20 μm, preferably 4-15 μm, most preferably 5-12 μm.

In one embodiment of the present invention the coating further comprises a bonding layer comprising a fine grained TiN, TiCN, TiCNO, TiCO or TiC located outermost of the refractory layer and adjacent to the $\alpha$-$Al_2O_3$ layer. The bonding layer is preferably deposited by HTCVD. The bonding layer is to enhance the adhesion between the refractory layer and the $\alpha$-$Al_2O_3$ layer. The bonding layer is preferably oxidized prior to the $\alpha$-$Al_2O_3$ layer deposition. The bonding layer comprises non-columnar grains, for example equally axed grains.

In one embodiment of the present invention the substrate is cemented carbide, cermet or ceramic. These substrates have hardnesses and a toughnesses that suits the coating of the present invention.

In one embodiment of the present invention the substrate of the coated cutting tool consists of cemented carbide comprising 4-12 wt % Co, optionally 0.3-10 wt % cubic carbides, nitrides or carbonitrides of metals from groups IVb, Vb and VIb of the periodic table, preferably Ti, Nb, Ta or combinations thereof, and balance WC.

In one embodiment of the present invention the substrate consists of cemented carbide with a binder phase enriched surface zone. The thickness of the binder phase enriched surface zone is preferably 5-35 μm as measured from the surface of the substrate and towards the core of the substrate. The binder phase enriched zone has a binder phase content at least 50% higher than the binder phase in the core of the substrate. A binder phase enriched surface zone enhances the toughness of the substrate. A substrate with a high toughness is preferred in cutting operations such as turning of steel.

In one embodiment of the present invention the substrate consists of cemented carbide with a surface zone essentially free from cubic carbides. The thickness of the surface zone essentially free from cubic carbides is preferably 5-35 μm as measured from the surface of the substrate and towards the core of the substrate. By "essentially free" means that no cubic carbides is visible in an ocular analyse of a cross section in a light optical microscope.

In one embodiment of the present invention the substrate consists of a cemented carbide with a binder phase enriched surface zone as disclosed above in combination with a surface zone essentially free from cubic carbides as disclosed above.

In one embodiment of the present invention the $\alpha$-$Al_2O_3$ layer is the outermost layer of the coating. Alternatively, one or more further layers can be deposited on top of the $\alpha$-$Al_2O_3$ layer, such as layers of TiN, TiC, $Al_2O_3$ and/or combinations thereof, preferably TiN. In one embodiment of the present invention the one or more further layers deposited on the $\alpha$-$Al_2O_3$ layer is/are removed from the flank face or from the rake face or from the cutting edge or combinations thereof. The thickness of an outermost layer deposited on the $\alpha$-$Al_2O_3$ layer is preferably 1-3 μm.

In one embodiment of the present invention the coating is post treated by blasting or brushing to release tensile stresses of the CVD coated layers and to reduce the surface roughness.

DETAILED DESCRIPTION

Methods
CVD Coating Deposition

The CVD coatings in the examples below were deposited in a radial Ion bond type CVD equipment 530 size capable of housing 10000 half-inch size cutting inserts.
Dielectric Loss Measurements A measurement of dielectric loss properties is here disclosed based on the example of coated cutting tool disclosed in the Example section below. The TiN layer and the TiCN layer can be replaced by other conductive layer and the corresponding measurement can be performed. Alternatively an electrical conducting substrate (for example cemented carbide) can replace the TiCN in the measurement such that the substrate can be exposed and connected instead of the TiCN.

The dielectric loss properties of the deposited $\alpha$-$Al_2O_3$ layer were analysed by using laser ablation to define a parallel plate capacitor structure, where an isolated area 8 of electrically conducting TiN on the $\alpha$-$Al_2O_3$ layer serves as a top contact (upper plate). Below the $\alpha$-$Al_2O_3$ layer an electrical conducting TiCN layer is present that is to represent the lower contact (lower plate). The contact to the lower plate is obtained by laser ablation to expose an TiCN area 6 adjacent to the top contact 8. The volume of the $\alpha$-$Al_2O_3$ layer located between the two plates represents the capacitor dielectric and is to be analysed, and it is assumed to be the projected area of the isolated TiN area 8 that is affecting the resulting dielectric loss value tan $\delta$.

Laser was used on the coated surface of the insert to define structures such that the dielectric loss properties could be measured. The laser was used to selectively remove parts of the coating.

Figure 1:
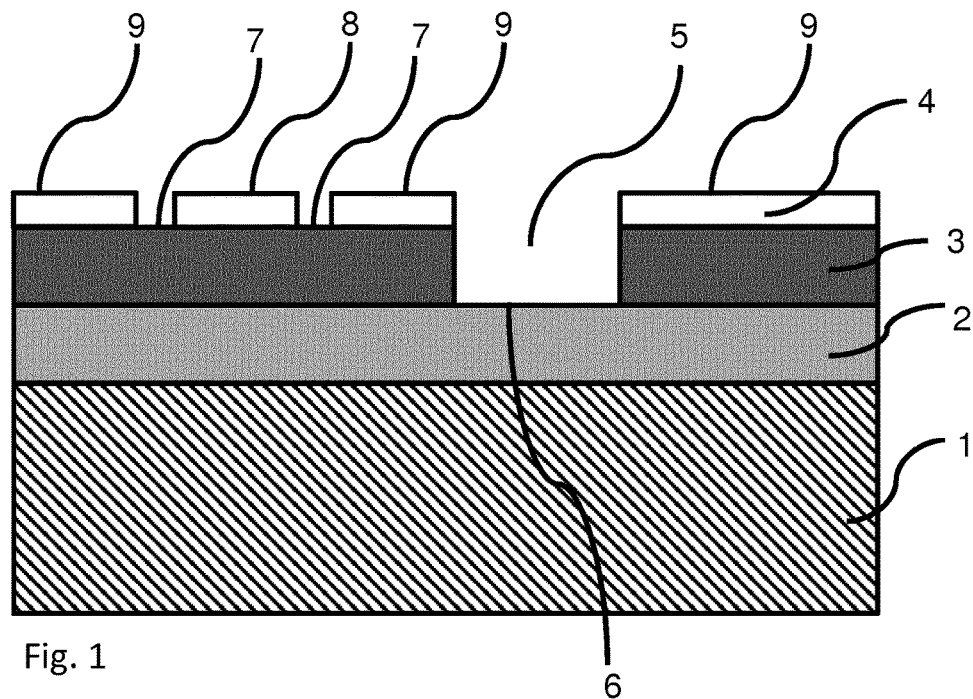
FIG. 1 is a schematic view of a cross section of a part of a cutting insert prepared for a dielectric loss measurement of the $\alpha$-$Al_2O_3$ layer 3.

FIG. 1 shows a schematic cross section of a part of a coated cutting tool (cutting insert) showing the substrate 1, an inner TiCN layer 2, and $\alpha$-$Al_2O_3$ layer 3, an uppermost TiN layer 4, an area 5 of exposed TiCN 6, trenches of exposed $\alpha$-$Al_2O_3$ 7, isolated TiN areas 8 and a surrounding TiN area 9.

Figure 2:
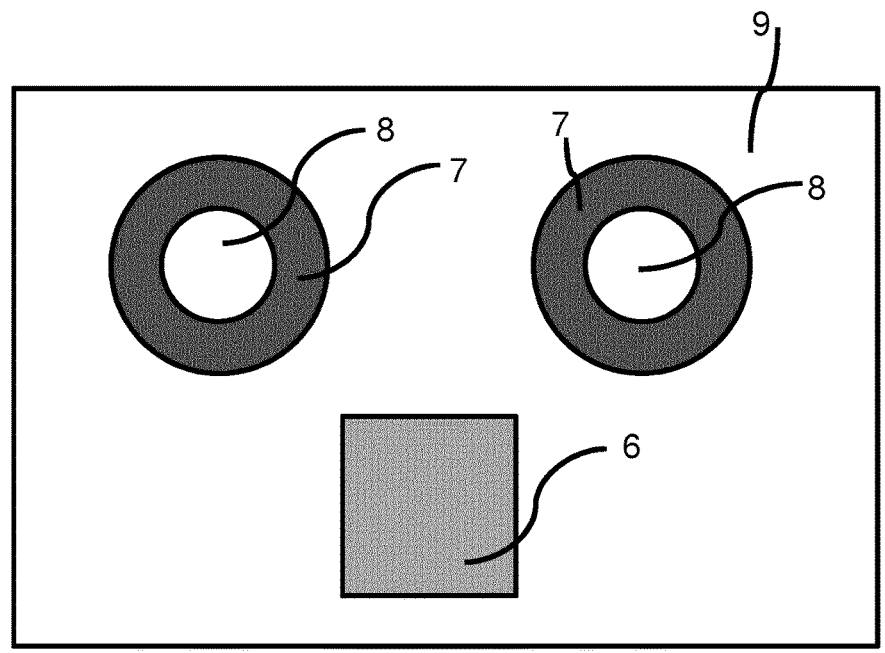
FIG. 2 is a schematic top view of a part of a surface of a cutting insert prepared for a dielectric loss measurement of the $\alpha$-$Al_2O_3$ layer 3.

FIG. 2 shows a schematic top view of a surface of a coated cutting tool prepared with defined structures as shown in FIG. 1, where two isolated TiN areas 8 are shown and one exposed TiCN 6 area.

Each insert to be tested was prepared with 14 isolated areas 8 and 3 separate areas of exposed TiCN 6 evenly distributed on a flank face of the insert. The diameter of the circular isolated TiN area was 1.288 mm, the width of the trench of exposed α-Al$_2$O$_3$ 7 surrounding the isolated TiN area 8 was 10 μm as measured in the radial direction from the centre of the isolated TiN area 8. The area of exposed TiCN 6 was a square of 1 mm×1 mm.

The dielectric loss measurement is performed using a HP 4284A Precision LCR Meter (20 Hz-1 MHz) adjusted to measure tan δ at 10 kHz, 100 mV and at room temperature (20° C.). In this measurement a parallel circuit mode (CP mode) was used. A rule of thumb is to use this CP mode if the capacitance is small and if the impedance of the capacitor is >10 kohm. In the present example each capacitor has a capacitance (C) of about 30 pF and the frequency (f) is 10 kHz. This gives the impedance (Z$_c$) of the capacitor as $Z_c=1/(2\pi fC)\approx 0.5$ MOhm>>10 kOhm.

One probe was connected to the isolated TiN area 8 and the other probe was connected to the exposed TiCN area 6. The duration of one measurement was about 180 ms.

It is to be noted that even if all the measurements in the present examples (as disclosed below) are based on an outer TiN layer and an inner TiCN in connection with the α-Al$_2$O$_3$ layer, also other layers with suitable electrical conducting properties can be used for the analyse of the dielectric properties of the α-Al$_2$O$_3$ layer.

X-Ray Diffraction Measurement

In order to investigate the texture of the layer(s) X-ray diffraction measurement was conducted on the flank face using a PANalytical CubiX3 diffractometer equipped with a PIXcel detector. The coated cutting tools were mounted in sample holders to ensure that the flank face of the samples are parallel to the reference surface of the sample holder and also that the flank face is at appropriate height. Cu-Kα radiation was used for the measurements, with a voltage of 45 kV and a current of 40 mA. Anti-scatter slit of ½ degree and divergence slit of ¼ degree were used. The diffracted intensity from the coated cutting tool was measured in the range 20° to 140° 2θ, i.e. over an incident angle θ range from 10 to 70°.

The data analysis, including background subtraction, Cu-K$_{\alpha 2}$ stripping and profile fitting of the data, was done using PANalytical's X'Pert HighScore Plus software. The output (integrated peak areas for the profile fitted curve) from this program were then used to calculate the texture coefficients of the layer by comparing the ratio of the measured intensity data to the standard intensity data according to a PDF-card of the specific layer (such as α-Al$_2$O$_3$), using the Harris formula (1) as disclosed above. Since the layer was a finitely thick film the relative intensities of a pair of peaks at different 2θ angles are different than they are for bulk samples, due to the differences in path length through the layer. Therefore, thin film correction was applied to the extracted integrated peak area intensities for the profile fitted curve, taken into account also the linear absorption coefficient of layer, when calculating the TC values. Since possible further layers above for example the α-Al$_2$O$_3$ layer will affect the X-ray intensities entering the α-Al$_2$O$_3$ layer and exiting the whole coating, corrections need to be made for these as well, taken into account the linear absorption coefficient for the respective compound in a layer. Alternatively, a further layer, such as TiN, above an alumina layer can be removed by a method that does not substantially influence the XRD measurement results, e.g. chemical etching.

In order to investigate the texture of the α-Al$_2$O$_3$ layer X-ray diffraction was conducted using CuK$_\alpha$ radiation and texture coefficients TC (hkl) for different growth directions of the columnar grains of the α-Al$_2$O$_3$ layer were calculated according to Harris formula (1) as disclosed above, where I(hkl)=measured (integrated area) intensity of the (hkl) reflection, I$_0$(hkl)=standard intensity according to ICDD's PDF-card no 00-010-0173, n=number of reflections to be used in the calculation. In this case the (hkl) reflections used are: (1 0 4), (1 1 0), (1 1 3), (0 2 4), (1 1 6), (2 1 4), (3 0 0) and (0 0 12).

It is to be noted that peak overlap is a phenomenon that can occur in X-ray diffraction analysis of coatings comprising for example several crystalline layers and/or that are deposited on a substrate comprising crystalline phases, and this has to be considered and compensated for by the skilled person. A peak overlap of peaks from the α-Al$_2$O$_3$ layer with peaks from for example TiCN layer might influence measurement and needs to be considered. It is also to be noted that for example WC in the substrate can have diffraction peaks close to the relevant peaks of the present invention.

EXAMPLES

Exemplifying embodiments of the present invention will now be disclosed in more detail and compared to reference embodiments. Coated cutting tools (inserts) were manufactured, analysed and evaluated in a cutting test.

Example 1 (Invention)

Cemented carbide substrates of ISO-type CNMG120408 for turning (samples E23C-1 and E23C-2) were manufactured from 7.2 wt-% Co, 2.7 wt % Ta, 1.8 wt % Ti, 0.4 wt % Nb, 0.1 wt % N and balance WC, comprising a Co enriched surface zone of about 25 μm from the substrate surface and to a depth into the body being essentially free from cubic carbides.

The inserts were first coated with a thin approximately 0.4 μm TiN-layer then with an approximately 7 μm TiCN layer by employing the well-known MTCVD technique using TiCl$_4$, CH$_3$CN, N$_2$, HCl and H$_2$ at 885° C. The volume ratio of TiCl$_4$/CH$_3$CN in an initial part of the MTCVD deposition of the TiCN layer was 6.6, followed by a period using a ratio of TiCl$_4$/CH$_3$CN of 3.7.

| Dep. of TiN and TiCN at 885° C. (balance H$_2$): | Pressure [mbar] | N$_2$ [vol %] | HCl [vol %] | TiCl$_4$ [vol %] | CH$_3$CN [vol %] |
|---|---|---|---|---|---|
| TiN | 400 | 48.8 | — | 2.44 | — |
| TiCN inner | 55 | 37.6 | — | 2.95 | 0.45 |
| TiCN outer | 55 | 7.8 | 7.8 | 2.38 | 0.65 |

On top of the MTCVD TiCN layer was a 1-2 μm thick bonding layer deposited at 1000° C. by a process consisting of three separate reaction steps. First a TiCN step using TiCl$_4$, CH$_4$, N$_2$, HCl and H$_2$ at 400 mbar, then a second step using TiCl$_4$, CH$_3$CN, CO, N$_2$, HCl and H$_2$ at 70 mbar and finally a third step using TiCl$_4$, CH$_3$CN, CO, N$_2$ and H$_2$ at 70 mbar and thereby producing a TiCNO bonding layer. During the second and third TiCNO deposition step some of the gases were continuously changed as indicated by a first and a second level in the Table. Prior to the start of the subsequent Al$_2$O$_3$ nucleation, the bonding layer was oxidized for 4 minutes in a mixture of CO$_2$, CO, N$_2$ and H$_2$.

| Dep. of TiCNO bonding layer at 1000° C., balance $H_2$: | Pressure [mbar] | $N_2$ [vol %] | $CH_4$ [vol %] | HCl [vol %] | CO [vol %] | $TiCl_4$ [vol %] | $CH_3CN$ [vol %] | $CO_2$ [vol %] |
|---|---|---|---|---|---|---|---|---|
| TiCN | 400 | 25.5 | 3.4 | 1.7 | — | 1.56 | — | — |
| TiCNO-1 | 70 | 12 | — | 1.2 | 1.2 | 1.5 | 0.4 | — |
| TiCNO-2 | 70 | 31.5 | — | — | 1.6 | 3.15 | 0.66 | — |
|  |  | 30.9 |  |  | 3.7 | 3.09 | 0.64 |  |
| TiCNO-3 | 70 | 31.1 | — | — | 3.7 | 3.11 | — | — |
|  |  | 30.8 |  |  | 4.6 | 3.08 |  |  |
| Oxidation | 55 | 30 | — | — | 12.5 | — | — | 3.7 |

On top of the bonding layer an $\alpha\text{-}Al_2O_3$ layer was deposited. The $\alpha\text{-}Al_2O_3$ layer was deposited at 1000° C. and 55 mbar in two steps. The first step using 1.2 vol-% $AlCl_3$, 4.7 vol-% $CO_2$, 1.8 vol-% HCl and balance $H_2$ giving about 0.1 µm $\alpha\text{-}Al_2O_3$ and a second step as disclosed below giving a total $\alpha\text{-}Al_2O_3$ layer thickness of about 5 µm. The second $\alpha\text{-}Al_2O_3$ deposition step was performed using 1.2% $AlCl_3$, 4.7% $CO_2$, 2.9% HCl, 0.58% $H_2S$ and balance $H_2$.

An outermost layer of about 1 µm TiN was deposited covering the $\alpha\text{-}Al_2O_3$ layer and thereby forming the samples E23C-1 and E23C-2.

Example 2 (Reference)

Cemented carbide substrates of ISO-type CNMG120408 for turning were manufactured from 7.2 wt-% Co, 2.7 wt % Ta, 1.8 wt % Ti, 0.4 wt % Nb, 0.1 wt % N and balance WC, comprising a Co enriched surface zone of about 25 µm from the substrate surface and to a depth into the body being essentially free from cubic carbides.

Inserts were first coated with a thin approximately 0.4 µm TiN-layer then with an approximately 8 µm TiCN layer by employing the well-known MTCVD technique using $TiCl_4$, $CH_3CN$, $N_2$, HCl and $H_2$ at 885° C. For the coating R25 the volume ratio of $TiCl_4/CH_3CN$ in an initial part of the MTCVD deposition of the TiCN layer was 3.7, followed by a period using a ratio of $TiCl_4/CH_3CN$ of 2.2.

On top of the MTCVD TiCN layer was a 1-2 µm thick bonding layer deposited at 1000° C. by a process consisting of three separate reaction steps. First a TiCN step using $TiCl_4$, $CH_4$, $N_2$, HCl and $H_2$ at 400 mbar, then a second step using $TiCl_4$, $CH_3CN$, CO, $N_2$, HCl and $H_2$ at 70 mbar and finally a third step using $TiCl_4$, $CH_3CN$, CO, $N_2$ and $H_2$ at 70 mbar and thereby producing a TiCNO bonding layer. Prior to the start of the $\alpha\text{-}Al_2O_3$ nucleation, the bonding layer was oxidized for 4 minutes in a mixture of $CO_2$, CO, $N_2$ and $H_2$.

Thereafter an $\alpha\text{-}Al_2O_3$ layer was deposited at 1000° C. and 55 mbar in two steps. The first step using 1.2 vol-% $AlCl_3$, 4.7 vol-% $CO_2$, 1.8 vol-% HCl and balance $H_2$ giving about 0.1 µm $\alpha\text{-}Al_2O_3$ and a second step using 1.16% $AlCl_3$, 4.7% $CO_2$, 2.9% HCl, 0.58% $H_2S$ and balance $H_2$ giving a total $\alpha\text{-}Al_2O_3$ layer thickness of about 5 µm.

The samples formed, R25C-1, R25C-2, also comprises an outermost layer of about 1 µm thick TiN.

Example 2b (Reference)

Cemented carbide substrates of ISO-type CNMG120408 for turning were manufactured from 7.2 wt-% Co, 2.7 wt % Ta, 1.8 wt % Ti, 0.4 wt % Nb, 0.1 wt % N and balance WC, comprising a Co enriched surface zone of about 25 µm from the substrate surface and to a depth into the body being essentially free from cubic carbides.

Inserts were first coated with a thin approximately 0.3 µm TiN-layer then with an approximately 8 µm TiCN layer by employing the well-known MTCVD technique using $TiCl_4$, $CH_3CN$, $N_2$, HCl and $H_2$ at 885° C. The volume ratio of $TiCl_4/CH_3CN$ during the MTCVD deposition of the TiCN layer was 2.2.

On top of the MTCVD TiCN layer was an about 1 µm thick bonding layer deposited at 1000° C. (HTCVD) by a process consisting of two reaction steps. First a TiCN step using $TiCl_4$, $CH_4$, $N_2$, HCl and $H_2$ at 55 mbar, then a second step using $TiCl_4$ and CO at 55 mbar. Prior to the start of the $\alpha\text{-}Al_2O_3$ nucleation, the bonding layer was oxidized for 4 minutes in a mixture of $CO_2$ and HCl.

Thereafter an $\alpha\text{-}Al_2O_3$ layer was deposited at 1000° C. and 55 mbar in two steps. The first step using 2.3 vol-% $AlCl_3$, 4.6 vol-% $CO_2$, 1.7 vol-% HCl and balance $H_2$ giving about 0.1 µm $\alpha\text{-}Al_2O_3$ and a second step using 2.2% $AlCl_3$, 4.4% $CO_2$, 5.5% HCl, 0.33% $H_2S$ and balance $H_2$ giving a total $\alpha\text{-}Al_2O_3$ layer thickness of about 5 µm.

The samples formed, R225C-1, R225C-2, also comprises an outermost layer of about 1 µm thick TiN.

Example 3 (Texture Analysis)

X-ray diffraction measurement was used to analyse the TC values of the $\alpha\text{-}Al_2O_3$ and the TiCN in accordance with the method as disclosed above. Two sample individuals of the coated CNMG120408 substrate were texture analysed and subsequently wear tested. The layer thicknesses were analysed in a light optical microscope by studying a cross section of each coating and the bonding layer is included in the TiCN layer thickness given in Table 2. The results are presented in Table 2.

The dielectric loss properties were analysed by measuring the tan δ in a method as disclosed above. The value given below is an average value of 14 measurements at separate structures provided on the flank face of each cutting tool.

TABLE 2

| (Thickness and diffraction data) | | | |
|---|---|---|---|
| Sample | Layer thickness TiCN [µm] | Layer thickness $\alpha\text{-}Al_2O_3$ [µm] | TC(0 0 12) of $\alpha\text{-}Al_2O_3$ | tan δ (average of 14 measurements) |
| E23C-1 | 9.1 | 5.1 | 7.66 | 21 × 10$^{-4}$ |
| E23C-2 |  |  |  | 11 × 10$^{-4}$ |
| R25C-1 | 8.6 | 5.2 | 6.87 | 26 × 10$^{-4}$ |

TABLE 2-continued (Thickness and diffraction data)

| Sample | Layer thickness TiCN [μm] | Layer thickness α-Al$_2$O$_3$ [μm] | TC(0 0 12) of α-Al$_2$O$_3$ | tan δ (average of 14 measurements) |
|---|---|---|---|---|
| R25C-2 | | | | $142 \times 10^{-4}$ |
| R225C-1 | 8.3 | 4.3 | 0 | $320 \times 10^{-4}$ |
| R225C-2 | | | | $300 \times 10^{-4}$ |

Example 4 (Cutting Test)

Prior to cutting wear tests the inserts were blasted on the rake faces in a wet blasting equipment using a slurry of alumina in water and the angle between the rake face of the cutting insert and the direction of the blaster slurry was about 90°. The aim of the blasting is to influence the residual stress in the coating and the surface roughness and thereby improve the properties of the inserts in the subsequent turning test.

The coated cutting tools of the ISO type CNMG120408 as blasted were tested in longitudinal turning in ball bearing steel (100CrMo7-3) using the following cutting data;
Cutting speed $v_c$: 220 m/min
Cutting feed, f: 0.3 mm/revolution
Depth of cut, $a_p$: 2 mm
Water miscible metal working fluid was used.
One cutting edge per cutting tool was evaluated.

In analyzing the crater wear, the area of exposed substrate was measured, using a light optical microscope. When the surface area of the exposed substrate exceeded 0.2 mm$^2$ the life time of the tool was considered to be reached. The wear of each cutting tool was evaluated after 2 minutes cutting in the light optical microscope. The cutting process was then continued with a measurement after each 2 minutes run, until the tool life criterion was reached. When the size of the crater area exceeded 0.2 mm$^2$ the time until the tool life criterion was met was estimated based on an assumed constant wear rate between the two last measurements. Beside crater wear, flank wear was also observed, but did not in this test influence the tool life. Two parallel tests were run for each type of coating, for example sample E23C-1 was tested in wear test 1 and the samples E23C-2 was tested in wear test 2. The results are shown in Table 3.

TABLE 3

(Wear performance)

| Coating | Crater wear test 1 [min] | Crater wear test 2 [min] |
|---|---|---|
| E23C | 51 | 55 |
| R25C | 27 | 28 |
| R225C | 16 | 18 |

While the invention has been described in connection with various exemplary embodiments, it is to be understood that the invention is not to be limited to the disclosed exemplary embodiments; on the contrary, it is intended to cover various modifications and equivalent arrangements within the appended claims.

The invention claimed is:

1. A coated cutting tool comprising a substrate coated with a coating having at least one layer, the at least one layer including a layer of α-Al$_2$O$_3$, wherein said α-Al$_2$O$_3$ layer exhibits a dielectric loss of $10^{-6} \leq \tan \delta \leq 25 \times 10^{-4}$, as measured with AC at 10 kHz, 100 mV at 20° C.

2. The coated cutting tool in accordance with claim 1, wherein the thickness of the α-Al$_2$O$_3$ layer is 2-20 μm.

3. The coated cutting tool in accordance with claim 1, wherein the dielectric loss tan δ of the α-Al$_2$O$_3$ layer is higher than or equal to $10^{-5}$.

4. The coated cutting tool in accordance with claim 1, wherein the dielectric loss tan δ of the α-Al$_2$O$_3$ layer is lower than or equal to $20 \times 10^{-4}$.

5. The coated cutting tool in accordance with claim 1, wherein the dielectric loss tan δ of the α-Al$_2$O$_3$ layer is measured on a flank face of the cutting tool.

6. The coated cutting tool in accordance with claim 1, wherein the α-Al$_2$O$_3$ layer exhibits a texture coefficient TC(hkl), as measured by X-ray diffraction using CuKα radiation and θ-2θ scan, defined according to Harris formula $$TC(hkl) = \frac{I(hkl)}{I_0(hkl)} \left[ \frac{1}{n} \sum_{n=1}^{n} \frac{I(hkl)}{I_0(hkl)} \right]^{-1} \quad (1)$$

where I(hkl) is the measured intensity (integrated area) of the (hkl) reflection, $I_0$(hkl) is the standard intensity according to ICDD's PDF-card No. 00-010-0173, n is the number of reflections used in the calculation, and where the (hkl) reflections used are (1 0 4), (1 1 0), (1 1 3), (0 2 4), (1 1 6), (2 1 4), (3 0 0) and (0 0 12), the TC(hkl) value being higher than 6.

7. The coated cutting tool in accordance with claim 6, wherein TC(0 0 12) of the α-Al$_2$O$_3$ layer is higher than 6.

8. The coated cutting tool in accordance with claim 1, wherein the α-Al$_2$O$_3$ layer exhibits a residual stress level of 100-500 MPa (tensile).

9. The coated cutting tool in accordance with claim 1, wherein the at least one layer of the coating includes a plurality of layers, the plurality of layers including a refractory layer having a material selected from the group TiCN, TiN, TiC, ZrN, ZrCN, ZrC, HfN, HfC, HfCN or combinations thereof.

10. The coated cutting tool in accordance with claim 9, wherein the thickness of said refractory layer is 4-20 μm.

11. The coated cutting tool in accordance with claim 1, wherein the at least one layer of the coating includes a plurality of layers, one of the plurality of layers being an outermost layer of TiN having a thickness of 1-3 μm.

12. The coated cutting tool in accordance with claim 1, wherein the substrate is cemented carbide, cermet, ceramic.

13. The coated cutting tool according to claim 9, wherein the TiCN refractory layer is located between the substrate and the α-Al$_2$O$_3$ layer.

\* \* \* \* \*